US006457155B1

(12) United States Patent
Dell et al.

(10) Patent No.: US 6,457,155 B1
(45) Date of Patent: Sep. 24, 2002

(54) METHOD FOR MAKING A MEMORY CARD ADAPTER INSERTABLE INTO A MOTHERBOARD MEMORY CARD SOCKET COMPRISING A MEMORY CARD RECEIVING SOCKET HAVING THE SAME CONFIGURATION AS THE MOTHERBOARD MEMORY CARD SOCKET

(75) Inventors: Timothy J. Dell, Colchester; Kent A. Dramstad, Essex Junction; Marc R. Faucher, So. Burlington; Bruce G. Hazelzet, Essex Junction, all of VT (US)

(73) Assignee: International Business Machines, Armonk, NY (US)

( * ) Notice: Subject to any disclaimer, the term of this patent is extended or adjusted under 35 U.S.C. 154(b) by 0 days.

(21) Appl. No.: 09/465,609

(22) Filed: Dec. 17, 1999

Related U.S. Application Data

(62) Division of application No. 09/032,448, filed on Feb. 27, 1998, now Pat. No. 6,108,730.

(51) Int. Cl.[7] ............................................. G11C 29/00
(52) U.S. Cl. ...................................... 714/773; 714/805
(58) Field of Search .................................. 714/773, 805

(56) References Cited

U.S. PATENT DOCUMENTS

| | | | |
|---|---|---|---|
| 4,656,605 A | 4/1987 | Clayton ........................ 257/724 |
| 4,958,322 A | 9/1990 | Kosugi et al. .......... 365/189.01 |
| 5,270,964 A | 12/1993 | Bechtolsheim et al. ........ 365/52 |
| 5,272,664 A | 12/1993 | Alexander et al. ........... 361/760 |
| 5,319,591 A | 6/1994 | Takeda et al. ................. 365/51 |
| 5,357,624 A | 10/1994 | Lavan .......................... 365/63 |
| 5,375,084 A | 12/1994 | Begun et al. .................. 365/63 |
| 5,383,148 A | 1/1995 | Testa et al. ..................... 365/52 |
| 5,428,762 A | 6/1995 | Curran et al. ................ 395/425 |
| 5,440,519 A | 8/1995 | Mart et al. ................... 365/226 |
| 5,465,229 A | 11/1995 | Bechtolsheim et al. ........ 365/52 |
| 5,504,700 A | 4/1996 | Insley et al. ................... 365/52 |
| 5,513,135 A | 4/1996 | Dell et al. ..................... 365/52 |
| 5,524,232 A | 6/1996 | Hajeer ......................... 395/442 |
| 5,544,008 A | 8/1996 | Dimmick et al. ........... 361/684 |
| 5,563,838 A | 10/1996 | Mart et al. ................... 365/226 |
| 5,604,871 A | 2/1997 | Pecone ....................... 395/281 |
| 5,623,506 A * | 4/1997 | Dell et al. ................... 714/766 |
| 5,745,914 A * | 4/1998 | Connolly et al. ........... 365/222 |
| 6,018,817 A * | 1/2000 | Chen et al. ................. 714/718 |
| 6,092,146 A * | 7/2000 | Dell et al. ................... 711/101 |
| 6,108,730 A * | 8/2000 | Dell et al. ................... 235/441 |
| 6,298,426 B1 * | 10/2001 | Ajanovic ............... 365/230.03 |

OTHER PUBLICATIONS

IBM Technical Disclosure Bulletin, "Stacking Single Inline Memory Module Card", Vol. 37, No. 10, Oct. 1994 pp. 353–354.

IBM Technical Disclosure Bulletin, "Memory Expansion Concept of Notebook PC", Vol. 37, No. 08, Aug. 1994 pp. 423–424.

* cited by examiner

Primary Examiner—Stephen M. Baker
(74) Attorney, Agent, or Firm—William N. Hogg

(57) ABSTRACT

A memory card adapter and method is provided which can add features or provide functions to a computer system's memory modules without having to replace and discard existing memory modules. An adapter is provided which has electrical contacts that are capable of being plugged into a memory module receiving socket of. a motherboard and a memory module receiving socket capable of receiving and retaining a memory module such as a SIMM. The adapter has logic, circuitry and/or memory chips to add new function to the existing memory module and also has all information and hardware needed for proper interface with the motherboard of the computer system. The present invention can add a variety of function such as parity, error correction code and error correction code on SIMM as well as convert signals which form from the system for use on the SIMM which signals in the form generate by the computer are not compatible with the SIMM.

6 Claims, 1 Drawing Sheet

METHOD FOR MAKING A MEMORY CARD ADAPTER INSERTABLE INTO A MOTHERBOARD MEMORY CARD SOCKET COMPRISING A MEMORY CARD RECEIVING SOCKET HAVING THE SAME CONFIGURATION AS THE MOTHERBOARD MEMORY CARD SOCKET

RELATED APPLICATIONS

This application is a divisional of application Ser. No. 09/032,448, filed Feb. 27, 1998, now U.S. Pat. No. 6,108,730.

FIELD OF THE INVENTION

The present invention relates to computer memory devices, and more particularly to a memory extension adapter apparatus for memory cards that allows parity or error correction code ("ECC") or function to be added to memory cards that do not have these capabilities.

BACKGROUND OF THE INVENTION

Computer systems utilize various integrated circuit devices for data storage and retrieval. Traditionally, a computer system's random access memory (RAM) primarily included a plurality of single bit integrated memory chips connected directly to the computer system's central processing unit ("CPU") motherboard. As computing technology improved, computer systems required more memory to support the various technological improvements. Thus, to expand the system memory of a computer, manufacturers began incorporating memory sockets into the motherboard capable of receiving memory modules on which memory chips had been mounted. This allowed for a computer system's memory capabilities to be expanded by addition of memory modules.

These memory modules are commonly referred to as single in-line memory modules ("SIMMs") with their plug-in socket referred to as a SIMM socket. By plugging a SIMM into a SIMM socket, the memory capacity of a computer system can be easily expanded. Currently, most computer systems are manufactured with several SIMM sockets included on the motherboard of the computer so that a computer user can add additional memory to the system as needed.

SIMMs are printed circuit boards ("PCB"s) built with memory chips mounted to the PCB and having connection pins along one edge of the PCB. The standard SIMM size is either a 30 pin version or a 72 pin version. The organization of a SIMM is described as the depth of the module by the width of module. The depth portion of this organization refers to the depth of memory chips located on the module. The width describes how many bits can be accessed at the same time by the computer system. Thus, for example, a "4M×8" SIMM is 4 MEGA address deep and 8 bits wide. While the standard memory module allows the amount of system memory to be upgraded, these modules do not allow any of the other functions of the system to be updated,. nor do the modules add any new functions besides increased memory. Furthermore, the modules themselves cannot have their function upgraded. Thus, while the amount of available memory may be expanded by the addition of memory modules, the modules do not add new function to the system..

For example, parity or ECC functions cannot be added to SIMMs in order to upgrade the memory module and accordingly add these features to a computer system. If the features of a memory module are desired to be upgraded, an all-new memory card having the desired function(s) must be substituted into the computer system with the existing module being removed and discarded. Thus, the old SIMMs must be completely discarded and replaced to add new features to a computer system by way of a memory module.

Currently, the most common type of a memory SIMM is the so-called "×32 SIMM" which is a non-parity in-line memory module. A ×32 SIMM contains enough DRAMs to support the reading and writing of 8 data bits per byte, but does not support any other functions such as parity,ECC, ECC on SIMM, non-standard interface levels or non-standard voltage power supplies. Therefore, to be able to upgrade a computer system that uses ×32 SIMMs to have parity, ECC, ECC on SIMM or other new and added functions, the ×32 SIMMs must be discarded and replaced with entirely new SIMMs having the desired configuration and features.

Thus, since existing SIMMs must be discarded in order to upgrade memory module features and functions, there exists a need for a memory module adapter with added features such as parity, ECC, ECC on SIMM,; non-standard interface levels and/or non-standard power supplies which is configured to add these functions to existing memory modules lacking these functions so chat existing memory modules do not have to be replaced.

SUMMARY OF THE INVENTION

The apparatus of this invention provides a memory adapter with added features such as parity or error correction code. The adapter has an electrical edge connector along a first edge which is capable of plugging into a standard memory card socket located on a computer system's motherboard. Opposite the edge of the adapter having the electrical edge connector, the adapter has a card receiving socket capable of receiving an in-line memory module. The existing SIMM is plugged into this socket located on the adapter. The adapter contains all logic and memory chips necessary to add new functions to the existing module, and the adapter contains all information and hardware needed for proper interface with the computer system through the motherboard. A variety of functions such as parity, error correction code, error correction code on SIMM and double or triple redundancy can be added to existing SIMMs which lack these functions by application and use of the present invention. Also, the invention provides for changing voltage levels when the interface types between the SIMM and the system are different. Thus, existing SIMMs can be upgraded and still utilized in a computer system without having to be entirely replaced and discarded in order to upgrade a computer system.

Therefore, it is an object of the present invention to provide the memory card adapter which has an edge connector for plugging a memory card adapter into a memory card receiving socket located on a computer system's motherboard, the memory card adapter also having a connector socket for receiving an in-line memory module or memory card.

It is a further object of the present invention to provide a memory card adapter with features such as parity, ECC, or ECC on board being included on the adapter so that these functions can be added to a computer system without discarding the system's existing memory modules.

It is yet another object of the present invention to provide a memory card adapter with added features that are compatible with a computer system's existing memory modules while also having logic and memory to control and communicate with the added features.

DETAILED DESCRIPTION OF THE INVENTION

The present invention can exist in any number of environments, but will be described in the context of an IBM Personal Computer using an Intel 80486 or Pentium® microprocessor and with Dynamic Random Access Memory. Embodiments are provided of the present invention utilizing single in-line memory modules ("SIMMs") however it is contemplated the dual in-line memory modules ("DIMMs") could also be used with the present invention, or subsequently developed memory modules..

The present invention provides a. memory card adapter 10 in which the adapter provides added features to a computer system without requiring the replacement of the computer system's existing memory cards.

Figure 1:
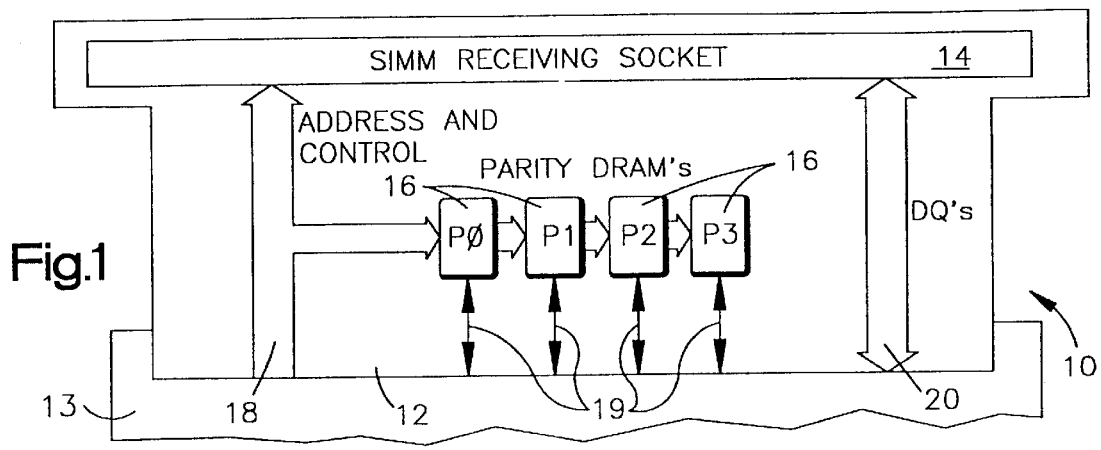
FIG. 1 is a memory card adapter according to this invention containing additional memory for parity.

As best seen in FIG. 1, a memory card adapter 10 of the present invention is provided having a bottom edge having an electrical edge connector 12 thereon to plug into a card socket of a motherboard of a computer system 13, and a top edge having a card receiving socket 14 thereon. In an embodiment capable of accepting SIMMs, the electrical edge connector is a 72 pin SIMM edge connector and the card receiving socket 14 is a 72 pin SIMM receiving socket. Furthermore, as shown in FIG. 1, the adapter 10 has four parity DRAMs 16 included on the adapter. The parity DRAMs 16 are the same address dimension as that of the existing SIMM which is to be plugged or inserted into the card receiving socket of the adapter 10. This embodiment is used when the system generates and checks parity bits.

All address and data control lines 18 are routed from the electrical edge connector 12 of the adapter 10 directly to the SIMM receiving socket 14 so that when the existing SIMM is plugged into the adapter 10, and the adapter 10 is plugged into the motherboard, the SIMM receives signals from the computer system just as if it were directly plugged into the socket on the motherboard of the computer system. While the SIMM inserted into the adapter 10 receives signals from the computer system via the adapter's SIMM receiving socket, minor propagation delay may occur at times when sending a signal from the system through the adapter 10 to the SIMM. Also, when control signals are sent from the computer system through the adapter 10 to the SIMM, these control signals are tapped into by the adapter 10 for the purpose of controlling parity DRAMs 16 located on the adapter.

Additionally, the parity DRAMs 16 of the adapters have parity data input/output ("PQ"s) 19 which are directly wired to the electrical edge connector 12 of the adapter so that the parity DRAMs 16 may access and provide data to and from the system. The data input/outputs ("DQs") 20 of the SIMM are not affected by the PQs 19 and are passed directly from the electrical edge connector 12 to the SIMM receiving socket and on to the SIMM.

To further demonstrate how the parity adapter 10 embodiment works, if. the existing SIMM, which lacks parity, is a 4M×32 SIMM, the parity DRAMs 16 on the adapter can be industry standard 4M×1 DRAMs. After the adapter 10 is plugged into the motherboard, each parity DRAM 16 on. the adapter receives addresses, column activation strobe ("CAS"), row address strobe ("RAS") and write enable ("WE") from the motherboard of the computer system. For example, the first DRAM on the adapter, whose parity input/output is P0, receives CAS0, which controls byte 0 on the SIMM. Thus, the remaining DRAMs 16, P1 through P3, receive the corresponding CAS lines and accordingly control the corresponding byte. Thus, the 4M×32 architecture of the SIMM as manufactured is maintained, but parity is added. By adding parity to the SIMM, the computer interfaces with the adapter/4M×32 SIMM assembly as if it were a 4M×36 SIMM with parity. Thus, the capabilities and functions of the system are improved by adding parity to the SIMMs but without the expense of discarding and replacing the SIMMs configured for parity.

In another embodiment, the adapter card 10 is used to form a ×36 or ×40 ECC SIMM. To yield the ECC SIMM, the electrical edge connector 12 and SIMM receiving sockets 14 are identical to those utilized by the parity embodiment of the present invention. In the ECC SIMM embodiment, however, the adapter has one or two ×4 DRAMs located on the adapter. These DRAMs have DQs wired to, appropriate tabs on the 72-pin electrical edge connector. Also, the CAS lines are all dotted together so that CAS0 drives all the DRAMs on the adapter and not just byte 0 of the DRAMs. This embodiment also is for use with a system which. performs ECC functions.

Figure 2:
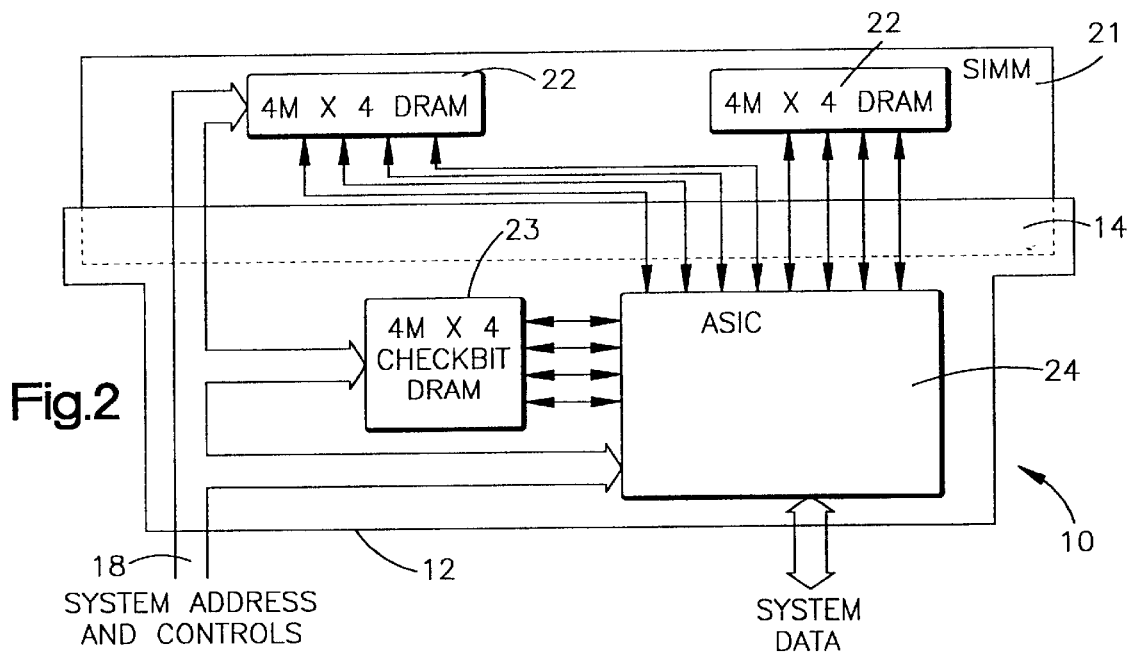
FIG. 2 is a memory card adapter according to this invention having additional memory for check bits and a system for writing and reading check bits and performing ECC functions.

FIG. 2 illustrates yet another embodiment in which an industry standard ×32 SIMM is retrofitted with an ECC-on-SIMM adapter 10 to perform on-board ECC. This adapter is for use on a system that does not have native ECC capabilities. As seen in FIG. 2, to retrofit; the ×32 SIMM, each byte of data on SIMM 21 having DRAM 22 for data storage requires an additional 4 bits of checkbit DRAM. SIMM checkbit DRAM 23 is provided at the same address depth as the ×32 DRAM 22 on the SIMM 21. The remaining three bytes (not shown) of SIMM 21 have identified additional checkbit DRAM (not shown) added to adapter 10.

Figure 3:
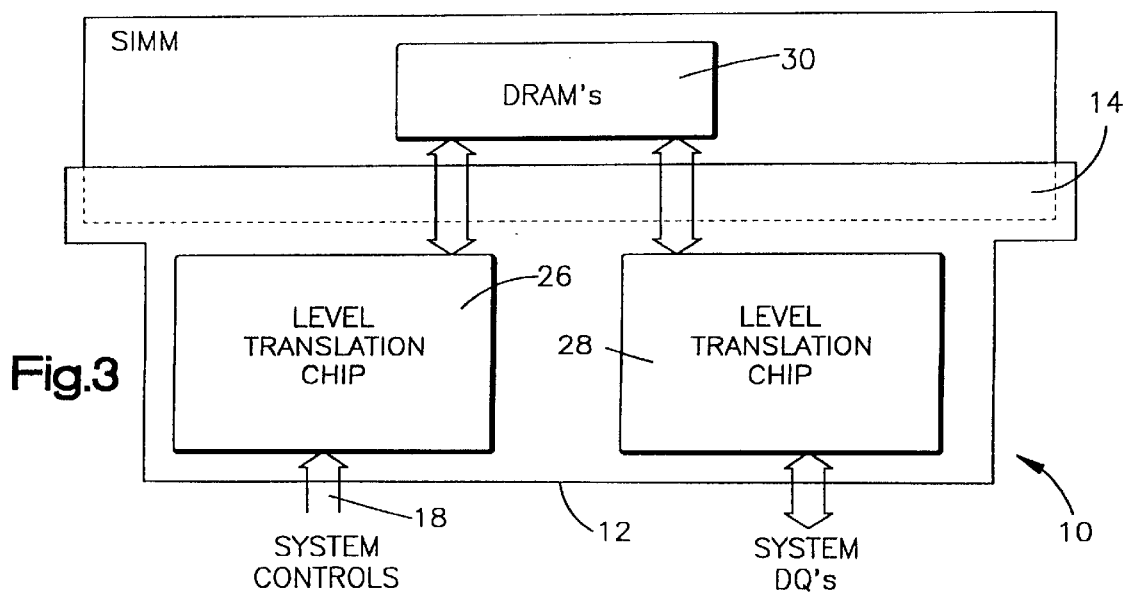
FIG. 3 is a memory card adapter for translating signal voltage levels when the interface between the system and the SIMM are different.

Furthermore, to yield an ECC-on-SIMM, each byte of data passes through ECC logic which is located in an ASIC 24 ("application specific integrated circuit") on the adapter 10. Each byte of data passes through this ECC logic so either- four low-pin-count ASICs or a single high-pin-count ASIC are workable. As illustrated by FIG. 2, system addresses and control pass through the adapter to the existing SIMM, and are also tapped into by both the DRAMs 23 and ASIC 24 of the adapter 10. Also, the system data is passed from the motherboard to the ASIC 24 of the adapter which then passes the data bits to the appropriate DQs on the DRAMs on the SIMM. Finally, the checkbit DRAMs of the adapter are in communication with the ASIC. Thus, in this embodiment ECC functions are performed by the ECC logic contained in the ASIC 24 (which logic is well know, e.g. of the type described is commonly assigned U.S. Pat. Nos. 5,450,422 and 5,465,262 both of which are incorporated herein by reference) and data that has become corrupted after writing to the SIMM 21 is corrected on a subsequent read cycle. It is to be understood that in the same manner generating and checking parity can be performed by using an ASIC with parity generating with check logic in conjunction with the DRAM for storage of checkbits. An interface for changing signal voltage levels when the interface types between the SIMM and the system are different is illustrated by FIG. 3. This embodiment provides. for an adapter card/SIMM assembly that allows for different interface voltage levels between the existing SIMM and the system. In this embodiment, the adapter 10 allows the system voltage levels which are GTL ("Gunning Transistor Logic") to be translated to the ×32 SIMM levels which are TTL ("Transistor-Transistor Logic"). The adapter has level translation chips 26 in which system control signals pass from the motherboard to the voltage translation chips 26 where the control signals are translated to the SIMM TTL level and then sent to the SIMM. Also, the system DQs are translated to SIMM 21 levels by level translation chip 28 on the adapter 12 before passing to DRAMs 30 of the SIMM 21. The translation may be uni-directional or bi-directional, with the Texas Instruments SN74GTL16612 18-Bit GTL/ LVT Universal Bus; Transceiver being an example of an. acceptable level translation device.

Another embodiment includes the addition of identification circuitry, such as a serial presence detect (SPD) erasable programmable read only memory (EPROM), that contains information different than what is contained on the SIMM's 21 SPD EPROM, when such different information is required by the using computer system to distinguish between the original function of the SIMM (e.g. non-parity) and the new function (e.g. parity) provided by the adapter and original SIMM together.

While the present invention has been illustrated by the description of the embodiments thereof, and while these embodiments have been described in considerable detail, it is not the invention to restrict or in any way limit the scope of the appended claims to such detail. Additional advantages and modifications may readily appear to those skilled in the art such as battery back-up for non-volatile operation, multiple SIMM sockets etc. Therefore, the invention, in its broadest aspects is not limited to the specific details, the representative apparatus, or the illustrative examples shown and described. Accordingly,. departures may be made from such details without departing from the spirit or scope of the applicants' general inventive concept.

We claim:

1. A method of changing the functionality of a memory card having DRAM memory thereon, comprising the steps of:

receiving system generated memory operating signals from a computer system; and utilizing said received signals to, provide a function not available on said memory card, and supplying memory operating signals to said memory card.

2. The method of claim 1, wherein said system generated signals have a first signaling value and the memory operating signals supplied to said memory card have a second signaling value.

3. The invention as defined in claim 1, wherein said function not available includes the storing of parity bits.

4. The invention as defined in claim 1, wherein the function not available includes the generation and checking of parity bits.

5. The invention as defined in claim 1, wherein the function not available includes storing ECC bits.

6. The invention as defined in claim 5, wherein the function not available includes generating and checking ECC bits and performing ECC functions.

* * * * *